US009960338B2

United States Patent
Nakamura (10) Patent No.: US 9,960,338 B2
(45) Date of Patent: May 1, 2018

(54) LAMINATED THERMOELECTRIC CONVERSION ELEMENT

(71) Applicant: Murata Manufacturing Co., Ltd., Nagaokakyo-shi, Kyoto-fu (JP)

(72) Inventor: Takanori Nakamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 177 days.

(21) Appl. No.: 15/055,897

(22) Filed: Feb. 29, 2016

(65) Prior Publication Data

US 2016/0181503 A1 Jun. 23, 2016

Related U.S. Application Data

(63) Continuation of application No. PCT/JP2014/074048, filed on Sep. 11, 2014.

(30) Foreign Application Priority Data

Oct. 11, 2013 (JP) .................................. 2013-213964

(51) Int. Cl.
*H01L 35/32* (2006.01)
*H01L 35/34* (2006.01)
*H01L 35/22* (2006.01)

(52) U.S. Cl.
CPC ............ *H01L 35/325* (2013.01); *H01L 35/22* (2013.01); *H01L 35/32* (2013.01); *H01L 35/34* (2013.01)

(58) Field of Classification Search
CPC ....... H01L 35/22; H01L 35/32; H01L 35/325; H01L 35/34
See application file for complete search history.

(56) References Cited

U.S. PATENT DOCUMENTS

2010/0116308 A1 5/2010 Hayashi et al.
2011/0138593 A1 6/2011 Schuh et al.
(Continued)

FOREIGN PATENT DOCUMENTS

JP H06283765 A 10/1994
JP H08125240 A 5/1996
(Continued)

OTHER PUBLICATIONS

International Search Report issued for PCT/JP2014/074048, dated Oct. 21, 2014.
(Continued)

*Primary Examiner* — Bethany L Martin
(74) *Attorney, Agent, or Firm* — Arent Fox LLP (57) ABSTRACT

A plurality of p-type and n-type thermoelectric conversion layers extend between opposed heat absorption and heat release surfaces such that the layers alternate between the p-type and n-type thermoelectric conversion layers with a respective insulating layer located between each adjacent pair of thermoelectric conversion layers. Each of the insulating layers extends from a respective one of the heat absorption and heat release surfaces towards, but does not reach, the other of the heat absorption and heat release surfaces such that each insulating later is spaced from the other of the heat absorption and heat release surfaces by a respective length. First and second outer sets of insulating layers are located closest to the first and second end surfaces, respectively, The insulating layers of the first and second outer sets are spaced from the other of the heat absorption and heat release surfaces by a length which is longer than the insulating layers located inwardly of the first and second outer sets.

21 Claims, 7 Drawing Sheets

(56) References Cited

U.S. PATENT DOCUMENTS

2011/0226304 A1 9/2011 Hayashi et al.
2013/0306124 A1* 11/2013 Yajima .................... H01L 35/32
                                                              136/205
2014/0166064 A1 6/2014 Nakamura

FOREIGN PATENT DOCUMENTS

| JP | H11186626 A | 7/1999 |
| JP | 2009503828 A | 1/2009 |
| WO | WO 2009001691 A1 | 12/2008 |
| WO | WO 2010058464 A1 | 5/2010 |
| WO | WO 2013027661 A1 | 2/2013 |

OTHER PUBLICATIONS

Written Opinion of the International Searching Authority issued for PCT/JP2014/074048, dated Oct. 21, 2014.

* cited by examiner

FIG. 1

PRIOR ART

FIG. 2

PRIOR ART

LAMINATED THERMOELECTRIC CONVERSION ELEMENT

CROSS REFERENCE

The present application is a continuation of International application No. PCT/JP2014/074048, filed Sep. 11, 2014, which claims priority to Japanese Patent Application No. 2013-213964, filed Oct. 11, 2013, the entire contents of each of which are incorporated herein by reference.

TECHNICAL FIELD

The present invention relates to a laminated thermoelectric conversion element.

BACKGROUND ART

As an example of a laminated thermoelectric conversion element based on the prior art, International Publication No. WO 2009/001691 discloses an element referred to as a thermoelectric conversion module. This thermoelectric conversion module has a p-type oxide thermoelectric conversion material and an n-type oxide thermoelectric conversion material alternately laminated. The p-type oxide thermoelectric conversion material and n-type oxide thermoelectric conversion material adjacent to each other are directly joined in a certain region, and joined with an insulating material interposed therebetween in the other region. For the manufacture of the thermoelectric conversion module, sheets of the p-type oxide thermoelectric conversion material and sheets of the n-type oxide thermoelectric conversion material are each formed, and stacked to form a stacked body while providing the insulating material in a certain region, and this stacked body is subjected to firing. The firing makes the stacked body integrally sintered. External electrodes are formed on the sintered body.

SUMMARY OF THE INVENTION

Figure 10:
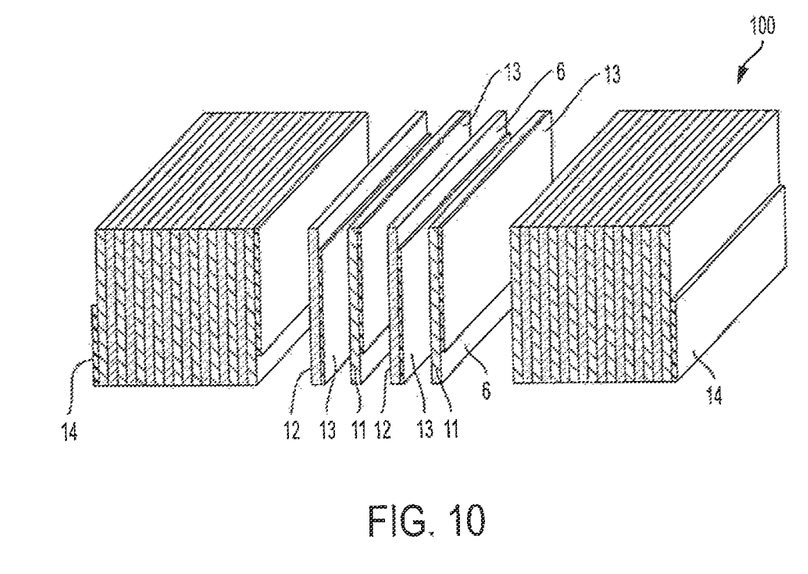
FIG. 10 is an explanatory diagram of a laminated thermoelectric conversion element based on the prior art.

It will be assumed that a laminated thermoelectric conversion element 100 is configured, for example, as shown in FIG. 10. In order to better show the internal structure of the laminated thermoelectric conversion element 100, the middle of the Figure is shown in an exploded view. In this example, the upper side serves as a side that should reach a high temperature, whereas the lower side serves as a side that should reach a low temperature. P-type thermoelectric conversion material layers 11 and n-type thermoelectric conversion material layers 12 are laminated alternately while insulating layers 13 are interposed therebetween in certain regions. The insulating layers 13 are disposed to cover only a portion of the thermoelectric conversion elements on which they are disposed so that a space 6 is left uncovered. The position of the space 6 alternates between the top and bottom of adjacent thermoelectric conversion elements as shown in FIG. 10. The p-type thermoelectric conversion material has a positive Seebeck coefficient, the n-type thermoelectric conversion material has a negative Seebeck coefficient. External electrodes 14 are formed on end surfaces.

Figure 11:
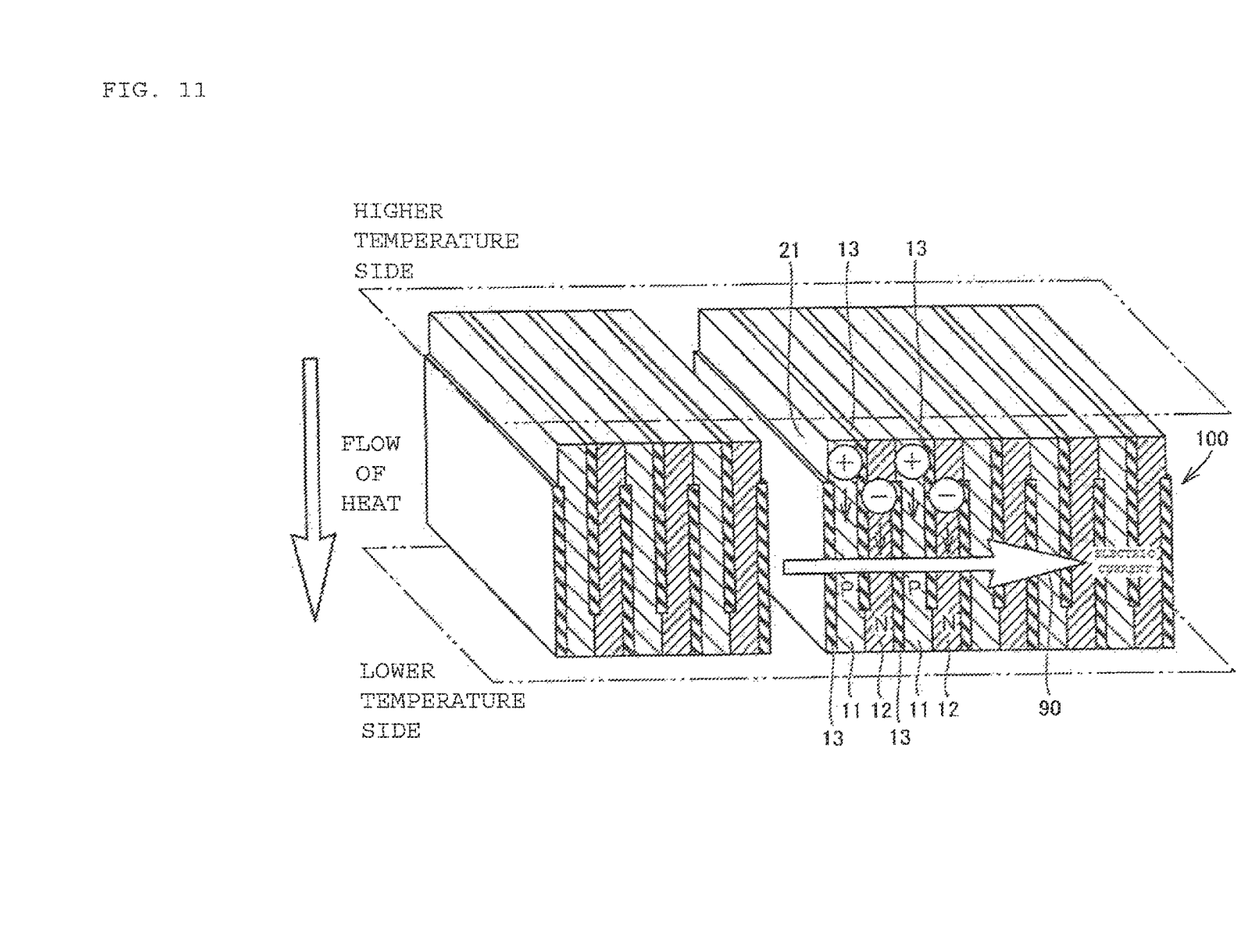
FIG. 11 is an explanatory diagram of the operation of the laminated thermoelectric conversion element based on the prior art.

In this laminated thermoelectric conversion element, when a temperature difference is applied as shown in FIG. 11, holes (+) move in the p-type thermoelectric conversion material layers 11, whereas electrons (−) move in the n-type thermoelectric conversion material layers 12. Current flows through the p-type and n-type thermoelectric conversion elements in a meandering or serpentine manner. More particularly, it flows between adjacent elements via the spaces 6 at which adjacent elements abut. The effective net flow of current is in the direction indicated by an arrow 90. A high electromotive force can be obtained depending on the number of laminated layers. If the spaces 6 are narrow (as viewed in the vertical direction of FIG. 11), a high resistance leads to power reduction.

Therefore, an object of the present invention is to provide a laminated thermoelectric conversion element which can prevent the resistance value from being nonnegligibly increased by a narrowed area at which adjacent p-type thermoelectric conversion material layers and an n-type thermoelectric conversion material layers directly abut one another.

Means for Solving the Problem

In order to achieve the object mentioned above, the laminated body in accordance with the present invention, comprises:

opposed, planar, heat absorption and heat release surfaces;

opposed end surfaces extending between the heat absorption and heat release surfaces;

a plurality of p-type and n-type thermoelectric conversion layers extending between the heat absorption and heat release surfaces, the p-type and n-type thermoelectric conversion layers arranged such that the layers alternate between the p-type and n-type thermoelectric conversion layers with a respective insulating layer located between each adjacent pair of thermoelectric conversion layers;

each of the insulating layers extending from a respective one of the heat absorption and heat release surfaces towards, but not reaching, the other of the heat absorption and heat release surfaces such that each insulating later is spaced from the other of the heat absorption and heat release surfaces by a respective length as measured in a direction perpendicular to the planes of the heat absorption and heat release surfaces; and first and second outer sets of insulating layers located closest to the first and second end surfaces, respectively, the insulating layers of the first and second outer sets being spaced from the other of the heat absorption and heat release surfaces by a length which is longer than the insulating layers located inwardly of the first and second outer sets.

Each of the thermoelectric conversion layers preferably lies in a plane perpendicular to the planes of the heat absorption and heat release surfaces. The first and second outer sets of insulating layers can comprises one, two or more insulating layers. They will be the closet insulating layers to the first and second end surfaces, respectively. The lengths of the spacing of the insulating layers of a given set need not be identical. However, they are all preferably longer than the length of the spacing of the insulating layers located inwardly (relative to the first and second end surfaces) of the first and second outermost sets. Preferably the length of the outmost of these insulating layers is greater than the length of the remaining insulating layers in the set.

The preferred positioning of the insulating layers is such that it causes current between the first and second opposed end surfaces in response to a heat differential between the heat absorbing and heat release surfaces to flows in a serpentine manner. The insulating layers are preferably printed layers.

Advantageous Effect of the Invention

According to the present invention, even when corners are scraped by barrel polishing from the original cuboid state, the region in which the p-type and n-type thermoelectric conversion materials directly abut one another can be kept from being significantly narrowed, and the resistance value can be prevented from being nonnegligibly increased.

PREFERRED MODE FOR CARRYING OUT THE INVENTION

In one mode for carrying out the present invention sheets of p-type thermoelectric conversion material and sheets of n-type thermoelectric conversion material are each formed in a large size, and alternately stacked to obtain a stacked body. "Large size" herein means a size corresponding to a plurality of laminated thermoelectric conversion elements such that a plurality of individual laminated thermoelectric conversion elements can be formed (preferably cut) from a single sheet. The stacked body in an unfired state referred to as a green body, is cut into the size of an individual laminated thermoelectric conversion element. At this point, barrel polishing is carried out for deburring. Thereafter, firing is carried out.

The order of the barrel polishing and firing may be reversed. More specifically, the green body may be subjected to firing first, and then barrel polishing for deburring.

Figure 1:
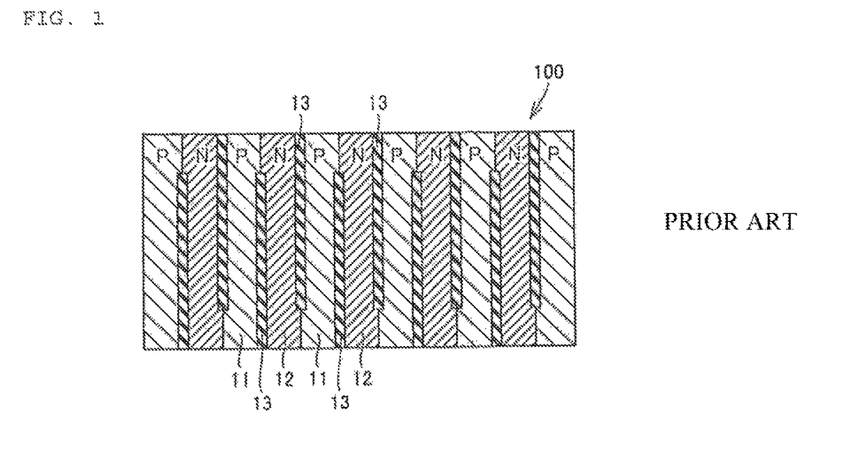
FIG. 1 is a cross-sectional view of a common laminated body before barrel polishing, to serve as a laminated thermoelectric conversion element.
Figure 2:
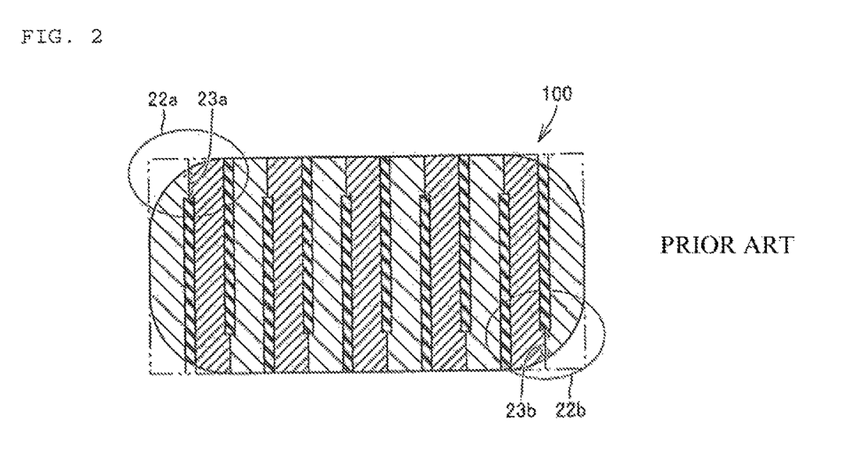
FIG. 2 is a cross-sectional view of a common laminated body after barrel polishing, to serve as a laminated thermoelectric conversion element.

Corners of the stacked body are scraped off and rounded by the barrel polishing. For example, a stacked body as shown in FIG. 1 is subjected to barrel polishing to scrape off corners as shown in FIG. 2. In particular, at parts 22a, 22b, the corners are scraped off to round the edges of the stacked body. This has the effect of reducing the lengths 23a, 23b of the interfaces between adjacent p-type and n-type thermoelectric conversion material layers at the outermost ends of the stacked body. This in turn increases the resistance value of the interface. The inventors have focused attention on the foregoing to achieve the present invention.

EMBODIMENT 1

Figure 3:
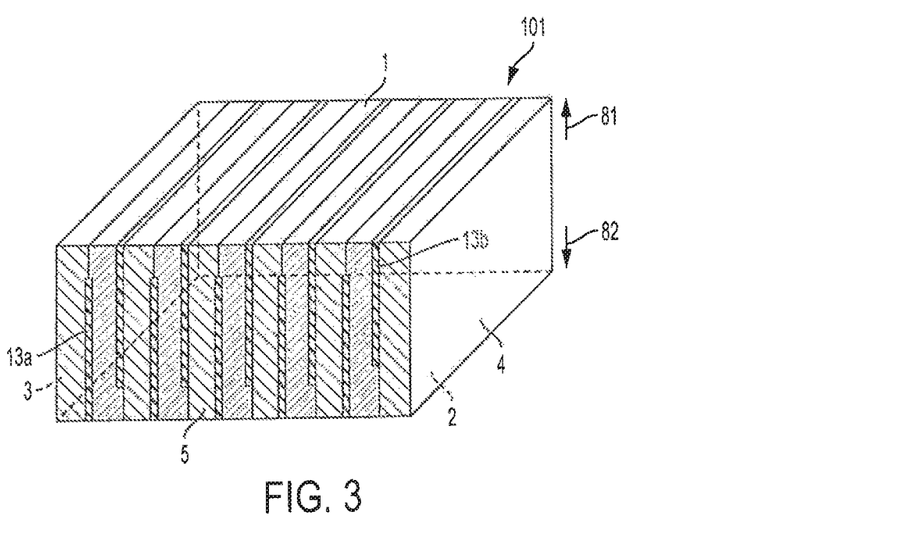
FIG. 3 is a perspective view of a laminated thermoelectric conversion element before barrel polishing according to Embodiment 1 in accordance with the present invention.
Figure 4:
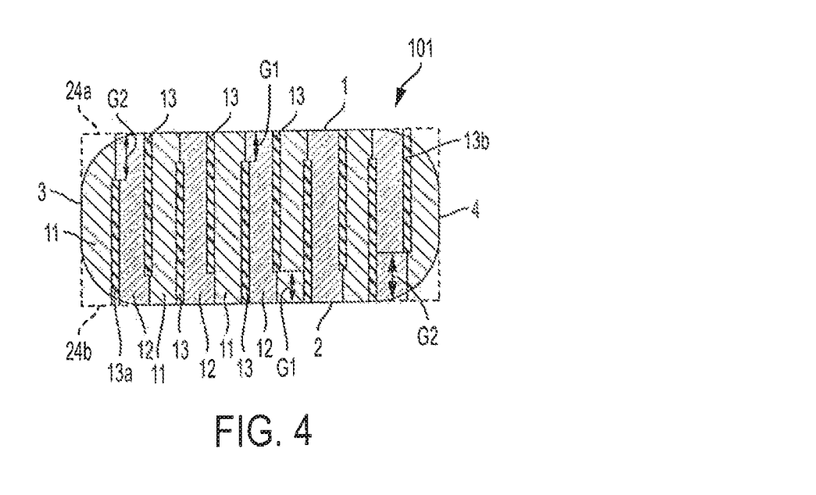
FIG. 4 is a cross-sectional view of the laminated thermoelectric conversion element according to Embodiment 1 in accordance with the present invention, as viewed from a first side surface.

A laminated thermoelectric conversion element 101 according to Embodiment 1 in accordance with the present invention will be described with reference to FIGS. 3 to 4. FIG. 3 shows the laminated thermoelectric conversion element 101 before barrel polishing. While the state before barrel polishing is illustrated for the sake of explanatory convenience herein, the final laminated thermoelectric conversion element 101 will have all rounded corners to some extent by barrel polishing.

The laminated thermoelectric conversion element 101 according to the present embodiment is a laminated thermoelectric conversion element including: first and second opposed end surfaces 3 and 4; a heat absorption surface 1 extending from an end of the first end surface 3 on a first side 81 to an end of the second end surface 4 on the first side 81; and a heat release surface 2 extending from an end of the first end surface 3 on a second side 82 opposite to the first side 81 to an end of the second end surface 4 on the second side 82, and to be opposed to the heat absorption surface 1. The laminated thermoelectric conversion element 101 has a front side surface 5 that connects the heat absorption surface 1 and the heat release surface 2. Each of the thermoelectric conversion layers extend between the heat absorption surface 1 and the heat release surface 2, preferably in a plane which is perpendicular to the planes of surfaces 1 and 2. FIG. 4 shows the laminated thermoelectric conversion element 101 as viewed from the front side surface 5.

As viewed from the front side surface 5 p-type thermoelectric conversion material layers 11 and n-type thermoelectric conversion material layers 12 are laminated alternately with insulating layers 13 partially interposed therebetween such that current flows in a meandering path.

In accordance with this embodiment of the invention, the length of the insulating layers 13a and 13b (as measured in a direction perpendicular to the plane of the surfaces 1 and 2) are shorter than the remaining insulating layers 13. As a result, the length G2 between the internal end of the insulating layers 13a and 13b and the respective heat absorption surface or heat release surface 2 is greater than the length G1 between the internal end of the remaining insulating layers 13 and the respective heat absorption surface or heat release surface 2.

As a result, when corners of the cuboid thermoelectric conversion element 101 are rounded by barrel polishing, the interface at which the adjacent p-type and n-type thermoelectric conversion materials abut can be kept from being significantly narrowed. Accordingly, the resistance value can be prevented from being nonnegligibly increased by a narrowed area with a p-type thermoelectric conversion material and an n-type thermoelectric conversion material directly joined. As used herein, the term "nonneglibly" means increased by less than 5%.

EMBODIMENT 2

A laminated thermoelectric conversion element 102 according to Second Embodiment in accordance with the present invention will be described with reference to FIG. 5. The laminated thermoelectric conversion element 102 according to the present embodiment differs in the following respect, although the basic configuration is common to the thermoelectric conversion element 101 described in Embodiment 1.

In the laminated thermoelectric conversion element 102 according to the present embodiment, as viewed from the front side surface 5, the internal end of the second outermost insulating layers 13c and 13d are recessed from the heat absorption surface 1 and the heat release surface 2, respectively, by a distance G3 which is greater than the distance G1.

Figure 5:
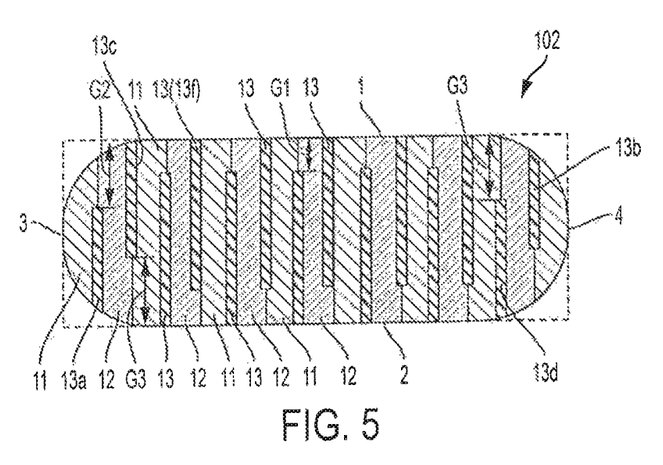
FIG. 5 is a cross-sectional view of a laminated thermoelectric conversion element according to Embodiment 2 in accordance with the present invention.

In FIG. 5, the second length G2 is comparable to the third length G3, by way of example only. The present embodiment may meet the relational expression: G2=G3, or meet the relational expression: G2>G3 or G2<G3. However, the present embodiment meets at least the relational expression: G3>G1.

While the increased lengths G2 and G3 have been described with reference to the four insulating layers 13a-13d, additional insulating layers directly inward of layers 13c and 13d can also be formed with internal ends of the insulating layers being spaced from their respective heat absorption and heat release surfaces 1 and 2 by a distance greater than the remaining inward insulating layers as viewed in FIG. 5.

In the present embodiment, the internal end of the insulating layer is recessed not only at the interface closest to the first end surface 3 or the second end surface 4, but also at the next inwardly interface, and thus, even when corners are scraped somewhat significantly by barrel polishing from the original cuboid state, the region in which the p-type and n-type thermoelectric conversion materials directly abut one another can be kept from being significantly narrowed. Accordingly, the resistance value can be prevented from being nonnegligibly increased by a narrowed area with a p-type thermoelectric conversion material and an n-type thermoelectric conversion material directly joined.

It is to be noted that the second length G2 is preferably longer than the third length G3. The amount scraped by the barrel polishing has a tendency to be increased at points closer to the end surfaces, and thus, with G2>G3, the region in which the p-type and n-type thermoelectric conversion materials are joined directly can be appropriately kept from being significantly narrowed.

It is to be noted that the insulating layers 13 are preferably rectangular in shape and formed by printing onto the surfaces of the p-type and n-type thermoelectric conversion material layers 11, or 12. With the layers formed by printing as just described, the position of the insulating layer end is easily set in a desired position, and a precisely structured laminated thermoelectric conversion element can be achieved in a simple manner.

An example of a manufacturing method that can be used to prepare a laminated thermoelectric conversion element configured as described in Embodiments 1 and 2 is now described.

Figure 6:
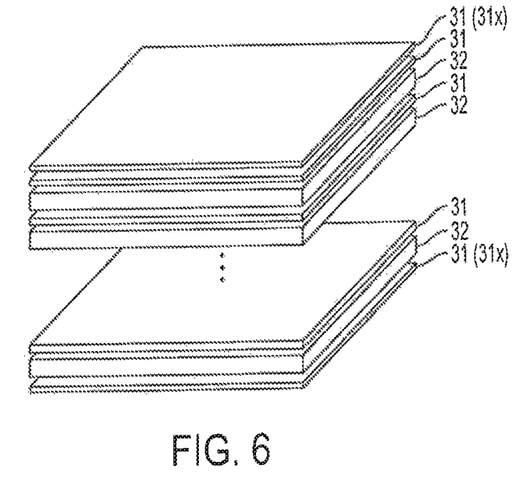
FIG. 6 is an explanatory diagram of a large-sized laminated body formed for obtaining the laminated thermoelectric conversion elements according to Embodiments 1 and 2 in accordance with the present invention.

As shown in FIG. 6, p-type thermoelectric conversion material sheets 31 and n-type thermoelectric conversion material sheets 32 are stacked in combination to form a large-sized stacked body. The p-type thermoelectric conversion material sheets 31 and the n-type thermoelectric conversion material sheets 32 are each a large-area sheet corresponding to a plurality of thermoelectric conversion elements. The large-sized stacked body is a large-sized stacked body corresponding to a plurality of thermoelectric conversion elements. The p-type and n-type sheets are alternately stacked at least in an intermediate part of the large-sized stacked body in the thickness direction.

In FIG. 6, the p-type thermoelectric conversion material sheets 31 differ significantly in thickness from the n-type thermoelectric conversion material sheets 32. This is intended to make the electrical resistance value uniform in the p-type part and n-type part of the element as a whole, because the electrical resistivity differs between the both layers due to the use of materials of different compositions for the both. Between the p-type and the n-type, layers of a material that is higher in electrical resistivity are formed to be thicker, whereas layers of a material that is lower in electrical resistivity are formed to be thinner.

The thus obtained large-sized stacked body includes a plurality of electrical connection routes in a meander form.

On the outer surfaces of the p-type thermoelectric conversion material sheets 31 stacked at the uppermost surface and lowermost surface of the large-sized stacked body, external electrodes or regions to be external electrodes for outputting electricity generated from the difference in temperature are arranged and formed so as to correspond to a plurality of laminated thermoelectric conversion elements.

The large-sized stacked body is then divided (typically cut) into a plurality of individual laminated thermoelectric conversion elements. The dividing operation may be performed by a well-known technique such as with a dicing saw. The thus divided stacked body is unfired, and thus referred to as a green body. The green body is then subjected to barrel polishing for deburring. Thereafter, firing is carried out. In this way, a fired body is obtained. Alternatively, the order of the barrel polishing and firing may be reversed. More specifically, the green body may be subjected to firing first, and then barrel polishing for deburring.

EXPERIMENT

The experiment performed for verifying advantageous effects of the present invention will be described below.

A metal Ni powder and a metal Mo powder were prepared as starting raw materials for the p-type thermoelectric conversion material. On the other hand, La2O3, SrCO3, and TiO2 were prepared as starting raw materials for the n-type thermoelectric conversion material. These starting raw materials were used, and weighed so as to provide the p-type and n-type thermoelectric conversion materials of the following compositions.

Here is the p-type composition:
20 wt % of Ni0.9Mo0.1+80 wt % of (Sr0.965La0.035)TiO3
Here is the n-type composition:
(Sr0.965La0.035)TiO3

For the n-type, the raw material powder was mixed in a ball mill with pure water as a solvent over 16 hours. The obtained slurry was dried, and then subjected to calcination at 1300° C. in the atmosphere. The obtained n-type powder and the raw materials for the p-type powder were each subjected to grinding in a ball mill over 5 hours. The obtained powders were further mixed over 16 hours with the addition of an organic solvent, a binder, etc. thereto, and the obtained slurry was formed into sheets by a doctor blade method. In this way, p-type and n-type thermoelectric conversion material sheets were obtained.

On the other hand, Zr0.97Y0.03O2 powder, varnish, and a solvent were mixed as materials for insulating layers, and prepared as a paste with a roll mill. This will be referred to as an "insulating paste". The obtained multiple p-type and n-type thermoelectric conversion material sheets were divided into a first group, a second group, and a third group.

The first group refers to sheets to be located in an intermediate part of the laminated body, and most of the sheets are included in the first group. The second group has several p-type and n-type thermoelectric conversion material sheets. The third group has only two p-type thermoelectric conversion material sheets.

Figure 7:
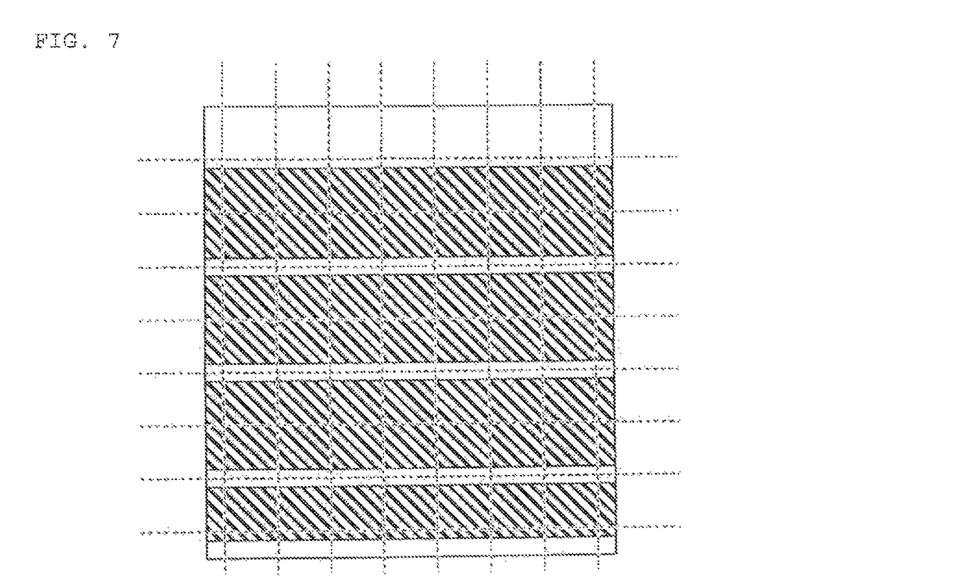
FIG. 7 is a plan view of an insulating paste applied on the surface of a first group of thermoelectric conversion material sheets in an experiment.

Onto the first group of p-type and n-type thermoelectric conversion material sheets, the prepared insulating paste was applied in the pattern shown in FIG. 7, so as to be 10 □m in thickness. In FIG. 7, the thickly hatched portions mean portions covered with the insulating paste. In this way, insulating layers were formed so as to partially cover the surfaces of the p-type and n-type thermoelectric conversion material sheets.

Figure 8:
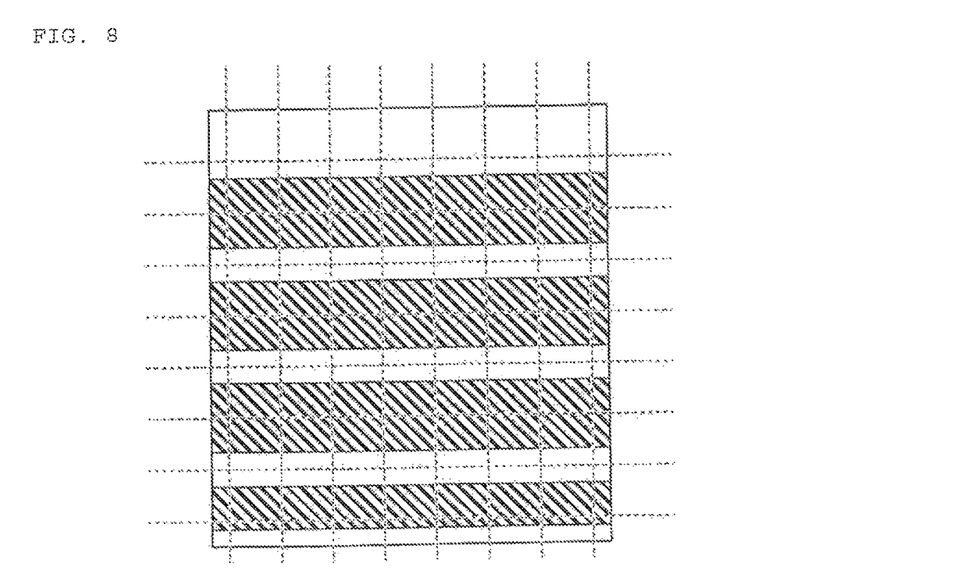
FIG. 8 is a plan view of an insulating paste applied on the surface of a second group of thermoelectric conversion material sheets in an experiment.

Onto the second group of p-type and n-type thermoelectric conversion material sheets, the prepared insulating paste was applied in the pattern shown in FIG. 8. As compared with the first group, only the pattern in planar view is different, with the same conditions such as the thickness of the insulating paste.

Figure 9:
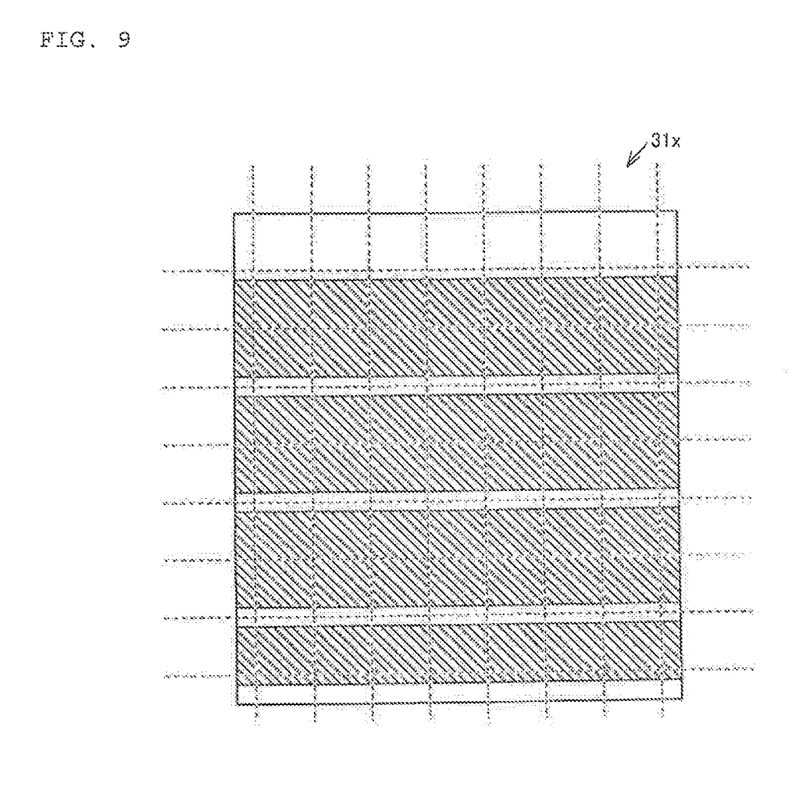
FIG. 9 is a plan view of a Ni paste applied on the surface of a third group of thermoelectric conversion material sheets in an experiment.

The third group of p-type thermoelectric conversion material sheets corresponds to a pair of p-type thermoelectric conversion material sheets 31x to serve as outermost layers. The insulating paste is not necessarily applied onto the third group of p-type thermoelectric conversion material sheets 31x. Therefore, the third group of p-type thermoelectric conversion material sheets has no insulating layer formed. Instead, to the third group of p-type thermoelectric conversion material sheets, a Ni paste was applied in the pattern shown in FIG. 9, so as to be 10 □m in thickness. In FIG. 9, the thinly hatched portions mean portions covered with the Ni paste. The Ni paste is intended to serve as Ni films subsequently. In this regard, the Ni films are regarded as external electrodes.

As Example 1, the p-type and n-type thermoelectric conversion material sheets were combined and stacked as shown in FIG. 6. The third group of p-type thermoelectric conversion material sheets 31x was disposed one by one in positions to serve as an uppermost surface and a lowermost surface. In positions adjacently in communication with the third group of p-type thermoelectric conversion material sheets 31x near the uppermost surface and the lowermost surface, the second group of thermoelectric conversion material sheets was stacked up to an appropriate number of sheets, so as to alternate p-type and n-type conductivities. In the intermediate part sandwiched by the second group, the first group of thermoelectric conversion material sheets was stacked so as to alternate p-type and n-type conductivities. The whole staked in this way was subjected to temporary pressure bonding.

The internal composition of the staked body subjected to temporary pressure bonding has the p-type thermoelectric conversion material layers including the Ni paste layers to be external electrodes: 120 □m in thickness, the p-type thermoelectric conversion material layers with the insulating layers formed: 30 □m in thickness, and the n-type thermoelectric conversion material layers with the insulating layers formed: 140 □m in thickness. The sheets were stacked so that fifty pairs of p-type and n-type were formed within the element.

The stacked body was subjected to pressure bonding at 180 MPa by an isostatic press method, thereby providing a compact. This compact was cut with a dicing saw into a predetermined size to obtain a green body.

The obtained green body was subjected to degreasing at 270° C. in the atmosphere. Thereafter, a fired body was obtained by firing at 1200 to 1300° C. in a reducing atmosphere with an oxygen partial pressure of 10-10 to 10-15 MPa. The applied Ni paste films were fired to turn into Ni films. The obtained fired body was subjected to deburring treatment by wet barrel polishing. The amount of edges removed by the barrel polishing in this case was 100 □m.

Thereafter, electrolytic Ni plating was carried out. The four surfaces other than the two surfaces with external electrodes to be formed were polished to remove excess Ni films. In this way, a laminated thermoelectric conversion element was prepared with only the two surfaces provided with external electrodes.

As a comparative example, among multiple p-type and n-type thermoelectric conversion material sheets, only first and third groups of sheets used to be combined and stacked were subjected to the respective steps in the same way to prepare a laminated thermoelectric conversion element.

As each of Example 1 and the comparative example, ten samples were prepared, and subjected to electrical resistance measurement. The measurement results are shown in Table 1.

TABLE 1

| | Electrical Resistance (Ω) in Example and Comparative Example | |
|---|---|---|
| Sample Number | Example 1 | Comparative Example |
| 1 | 3.8 | 38 |
| 2 | 5.3 | 48 |
| 3 | 4.3 | 36 |
| 4 | 4.2 | 32 |
| 5 | 4.8 | 40 |
| 6 | 3.9 | 44 |
| 7 | 4.9 | 39 |
| 8 | 4.4 | 37 |
| 9 | 4.7 | 37 |
| 10 | 5.1 | 49 |

As shown in Table 1, the samples of Example 1 are all low in electrical resistance, whereas the samples of the comparative examples are all high in electrical resistance, some of which are 40Ω or more.

From the experimental results, it is clear that Example 1 according to the present invention applied is superior to the comparative example at least in regard to the electrical resistance. Accordingly, it has been demonstrated that recessing the insulating layer end at interfaces closer to the first end surface and the second end surface through the application of the present invention makes it possible to keep the electrical resistance of the laminated thermoelectric conversion element low even in the condition subjected to barrel polishing, and successfully achieve the prevention of defective insulation.

It is to be noted that the embodiments disclosed therein are considered by way of example in all respects, but not to be considered limiting. The scope of the present invention is specified by the claims, but not the foregoing description, and considered to encompass all modifications within the spirit and scope equivalent to the claims.

The present invention can be used for laminated thermoelectric conversion elements.

The invention claimed is:

1. An elongated laminated body extending along a central axis such that the laminated body has a center and opposed first and second lateral ends located at opposite sides of the central axis, the laminated body comprising:
   opposing heat absorption and heat release surfaces;
   a plurality of insulating layers;

a plurality of p-type and n-type thermoelectric conversion layers extending between the heat absorption and heat release surfaces, the p-type and n-type thermoelectric conversion layers being arranged to alternate between the p-type and n-type thermoelectric conversion layers with one insulating layer of the plurality of insulating layers located between each adjacent pair of thermoelectric conversion layers;

a first set of insulating layers of the plurality of insulating layers extending perpendicular to the central axis from the heat absorption surface toward the heat release surface but not reaching the heat release surface such that each insulating layer of the first set of insulating layers is spaced from the heat release surface by a respective length as measured in a direction perpendicular to the central axis;

a second set of insulating layers of the plurality of insulating layers extending perpendicular to the central axis from the heat release surface toward the heat absorption surface but not reaching the heat absorption surface such that each insulating layer of the second set of insulating layers is spaced from the heat absorption surface by a respective length as measured in a direction perpendicular to the central axis;

the first set of insulating layers including at least one first laterally outermost insulating layer located closer to the first lateral end of the elongated laminated body than the remaining insulating layers of the first set of insulating layers, the length that the at least one first laterally outermost insulating layer is spaced from the heat release surface as measured in a direction perpendicular to the central axis being longer than the respective length that the remaining insulating layers of the first set of insulating layers are spaced from the heat release surface as measured in the direction perpendicular to the central axis; and the second set of insulating layers including at least one second laterally outermost insulating layer located closer to the second lateral end of the elongated laminated body than the remaining insulating layers of the second set of insulating layers, the length that the at least one second laterally outermost insulating layer is spaced from the heat absorption surface as measured in the direction perpendicular to the central axis being longer than the respective length that the remaining insulating layers of the second set of insulating layers are spaced from the heat absorption surface as measured in the direction perpendicular to the central axis.

2. The laminated body of claim 1, wherein each of the thermoelectric conversion layers lies in a respective plane which is perpendicular to the central axis.

3. The laminated body of claim 1, wherein the at least one first laterally outermost insulating layer is a single insulating layer.

4. The laminated body of claim 1, wherein the at least one first laterally outermost insulating layer comprises first and second insulating layers, the first insulating layer being located closer to the first lateral end of the elongated terminal body than the second insulating layer.

5. The laminated body of claim 4, wherein the length that the first insulating layer is spaced from the heat release surface is different than the length that the second insulating layer is spaced from the heat release surface.

6. The laminated body of claim 4, wherein the length that the first insulating layer is spaced from the heat release surface is less than the length that the second insulating layer is spaced from the heat release surface.

7. The laminated body of claim 3, wherein the at least one second laterally outermost insulating layer is a single insulating layer.

8. The laminated body of claim 1, wherein:
the at least one first laterally outermost insulating layer comprises first and second insulating layers, the first insulating layer being located closer to the first lateral end of the elongated terminal body than the second insulating layer; and
the at least one second laterally outermost insulating layer comprises third and fourth insulating layers, the third insulating layer being located closer to the second lateral end of the elongated terminal body than the fourth insulating layer.

9. The laminated body of claim 8, wherein:
the length that the first insulating layer is spaced from the heat release surface is different than the length that the second insulating layer is spaced from the heat release surface; and
the length that the third insulating layer is spaced from the heat absorption surface is different than the length that the fourth insulating layer is spaced from the heat absorption surface.

10. The laminated body of claim 8, wherein:
the length that the first insulating layer is spaced from the heat release surface is less than the length that the second insulating layer is spaced from the heat release surface; and
the length that the third insulating layer is spaced from the heat absorption surface is less than the length that the fourth insulating layer is spaced from the heat absorption surface.

11. The laminated body of claim 1, wherein the positioning of the plurality of insulating layers causes current which flows between the first and second lateral ends of the elongated laminated body in response to a heat differential between the heat absorbing and heat release surfaces to flow in a serpentine manner.

12. The laminated body of claim 1, wherein the at least one second laterally outermost insulating layer comprises first and second insulating layers, the first insulating layer being located closer to the second lateral end of the elongated terminal body than the second insulating layer.

13. The laminated body of claim 12, wherein the length that the first insulating, layer is spaced from the heat absorption surface is different than the length that the second insulating layer is spaced from the heat absorption surface.

14. The laminated body of claim 12, wherein the length that the first insulating layer is spaced from the heat absorption surface is less than the length that the second insulating layer is spaced from the heat absorption surface.

15. The laminated body of claim 1, wherein:
the heat absorption surface has a central planar portion and first and second curved outer portions which extend from the central planar portion to the first and second lateral ends of the elongated body, respectively, as viewed along a plane passing through the central axis; and
the heat release surface has a central planar portion and third and fourth curved outer portions which extend from the central planar portion of the heat release surface to the first and second lateral ends of the elongated body, respectively, as viewed along a plane passing through the central axis.

16. The laminated body of claim 15, wherein at least one of the insulators of the first set of insulating layers is located between the first and third curved outer portions of the heat absorption and heat release surfaces.

17. The laminated body of claim 16, wherein at least one of the insulators of the second set of insulating layers is located between the second and fourth curved outer portions of the heat absorption and heat release surfaces.

18. The laminated body of claim 15, wherein at least one of the insulators of the second set of insulating layers is located between the second and fourth curved outer portions of the heat absorption and heat release surfaces.

19. The laminated body of claim 1, wherein each of the first set of insulating layers, except for the first laterally outermost set of insulating layers, is spaced from the heat release surface by the same length as measured in the direction perpendicular to the central axis.

20. The laminated body of claim 12, wherein each of the second set of insulating layers, except for the second laterally outermost set of insulating layers, is spaced from the heat surface by the same length as measured in the direction perpendicular to the central axis.

21. The laminated body of claim 1, wherein each of the second set of insulating layers, except for the second laterally outermost set of insulating layers, is spaced from the heat surface by the same length as measured in the direction perpendicular to the central axis.

\* \* \* \* \*